United States Patent
Andarawis et al.

(10) Patent No.: US 7,378,837 B2
(45) Date of Patent: May 27, 2008

(54) METHOD AND SYSTEM FOR CALIBRATING A MICRO-ELECTROMECHANICAL SYSTEM (MEMS) BASED SENSOR USING TUNNELING CURRENT SENSING

(75) Inventors: Emad Andarawis Andarawis, Ballston Lake, NY (US); Ertugrul Berkcan, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/619,227

(22) Filed: Jan. 3, 2007

(65) Prior Publication Data

US 2007/0120553 A1  May 31, 2007

Related U.S. Application Data

(63) Continuation-in-part of application No. 11/289,910, filed on Nov. 30, 2005, now Pat. No. 7,221,144, which is a continuation-in-part of application No. 11/129,682, filed on May 13, 2005, now Pat. No. 7,315,161, which is a continuation-in-part of application No. 10/863,442, filed on Jun. 7, 2004, now Pat. No. 7,112,951.

(51) Int. Cl.
*G01R 33/00* (2006.01)
(52) U.S. Cl. ............... 324/158.1; 324/126; 324/117 R
(58) Field of Classification Search ............ None
See application file for complete search history.

(56) References Cited

U.S. PATENT DOCUMENTS

| | | | |
|---|---|---|---|
| 6,215,318 B1 * | 4/2001 | Schoefthaler et al. | 324/658 |
| 6,348,788 B1 | 2/2002 | Yao et al. | |
| 6,664,786 B2 | 12/2003 | Kretschmann et al. | |
| 6,734,660 B1 | 5/2004 | Berkcan et al. | |
| 7,112,951 B2 | 9/2006 | Berkcan et al. | |
| 2002/0021122 A1 | 2/2002 | Yao et al. | |
| 2004/0158439 A1 * | 8/2004 | Kim et al. | 702/190 |
| 2005/0270013 A1 | 12/2005 | Berkcan et al. | |
| 2005/0270014 A1 | 12/2005 | Zribi et al. | |
| 2006/0076947 A1 | 4/2006 | Berkcan et al. | |

* cited by examiner

*Primary Examiner*—Minh N. Tang
(74) *Attorney, Agent, or Firm*—Paul J. DiConza; William E. Powell, III

(57) ABSTRACT

A system and method for controlling a tunneling current between a first element and a second element of a micro-electro-mechanical system (MEMS) sensor. The system includes a tunneling current excitation source for providing a tunneling current between the elements and a tunneling current monitor for monitoring a change in the tunneling current responsive to movement of at least one element. The system also includes a positioner for positioning at least one of the elements and a controller in communication with the tunneling current monitor for controlling the positioner to position at least one of the elements at a first spacing between the elements for configuring the system in a referencing mode; and to position the elements at a second spacing for configuring the system in a sensing mode, whereby the system is calibrated with respect to the referencing mode.

28 Claims, 6 Drawing Sheets

METHOD AND SYSTEM FOR CALIBRATING A MICRO-ELECTROMECHANICAL SYSTEM (MEMS) BASED SENSOR USING TUNNELING CURRENT SENSING

RELATED APPLICATIONS

This application is a continuation-in-part of U.S. patent application Ser. No. 11/289,910 filed on Nov. 30, 2005, issued as U.S. Pat. No. 7,221,144 entitled "MICRO-ELECTROMECHANICAL SYSTEM (MEMS) BASED CURRENT & MAGNETIC FIELD SENSOR HAVING IMPROVED SENSITIVITIES," which in turn is a continuation-in-part of U.S. patent application Ser. No. 11/129,682 filed on May 13, 2005, issued as U.S. Pat. No. 7,315,161 entitled "MICRO-ELECTROMECHANICAL SYSTEM (MEMS) BASED CURRENT & MAGNETIC FIELD SENSOR HAVING CAPACITIVE SENSE COMPONENTS", which in turn is a continuation-in-part of U.S. patent application Ser. No. 10/863,442, filed on Jun. 7, 2004 issued as U.S. Pat. No. 7,112,951 on Sep. 26, 2006 entitled "MEMS BASED CURRENT SENSOR USING MAGNETIC-TO-MECHANICAL CONVERSION AND REFERENCE COMPONENTS," all of which are hereby fully incorporated by reference.

FIELD OF THE INVENTION

The present disclosure relates generally to electrical current and magnetic field sensing devices. More particularly, the present disclosure relates to a micro-electromechanical system (MEMS) current and magnetic field sensor using tunneling current sensing.

BACKGROUND OF THE INVENTION

It is known that a current carrying conductor produces a magnetic field in the vicinity of the current carrying conductor. It is also known that the magnetic field produced by the current carrying conductor can induce a force with another current carrying conductor disposed in the magnetic field produced by that current carrying conductor. As such, one approach used to sense electrical current involves the use of a sensor that measures the magnetic field induced by current flowing in a current carrying conductor. Since the generated magnetic field is proportional to the current flowing in the current carrying conductor, such a sensor can use the magnitude of the magnetic field to determine the current.

Current sensors that use magnetic fields to measure electrical current are well suited for high voltage applications from a safety perspective because they do not have to contact the high voltage circuitry. However, there are several disadvantages associated with existing current sensors that use magnetic fields to measure electrical current in high voltage applications. In general, existing current sensors tend to have a large form factor because they require a thick conductor that can withstand the varying levels of current flow that may be experienced. This current flow induces heating, which reduces the efficiency of the current sensors and introduces a possible error factor in sensor accuracy. Since existing current sensors are large and bulky, their physical and electrical operating characteristics have up to now prevented their use in smaller scale environments.

BRIEF DESCRIPTION OF THE INVENTION

In an example embodiment, the invention includes a system for controlling a tunneling current between a first element and a second element of a micro-electro-mechanical system (MEMS) sensor, wherein the first element and the second element are spaced apart from one another, at least the first element being movable relative to the second element responsive to a stimulus acting on at least the first element. The system includes a tunneling current excitation source for providing a tunneling current between a first element and a second element of a MEMS sensor and a tunneling current monitor for monitoring a change in the tunneling current responsive to movement of at least the first element relative to the second element. The system also includes a positioner for positioning at least one of the first element and the second element relative to one another and a controller in communication with the tunneling current monitor for controlling the positioner to position at least one of the first element and the second element at a first spacing between the first element and the second element for configuring the system in a referencing mode and to position at least one of the first element and the second element at a second spacing for configuring the system in a sensing mode, whereby the system is calibrated with respect to the referencing mode.

In another example embodiment, the invention includes a method for controlling a tunneling current between a first element and a second element of a micro-electro-mechanical system (MEMS) sensor, wherein the first element and second element are spaced apart from one another, at least the first element being movable relative to the second element responsive to a stimulus acting on at least one of the first element and second element. The method includes providing a tunneling current excitation source for generating a tunneling current between a first element and a second element of a MEMS sensor and providing a tunneling current monitor for monitoring a change in the tunneling current responsive to movement of at least the first element relative to the second element. The method further includes positioning at least one of the first element and the second element at a first spacing between the first element and second element for configuring the system in a referencing mode and positioning at least one of the first element and the second element at a second spacing different from the first spacing for configuring the system in a sensing mode, whereby the system is calibrated with respect to the referencing mode.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

Figure 1:
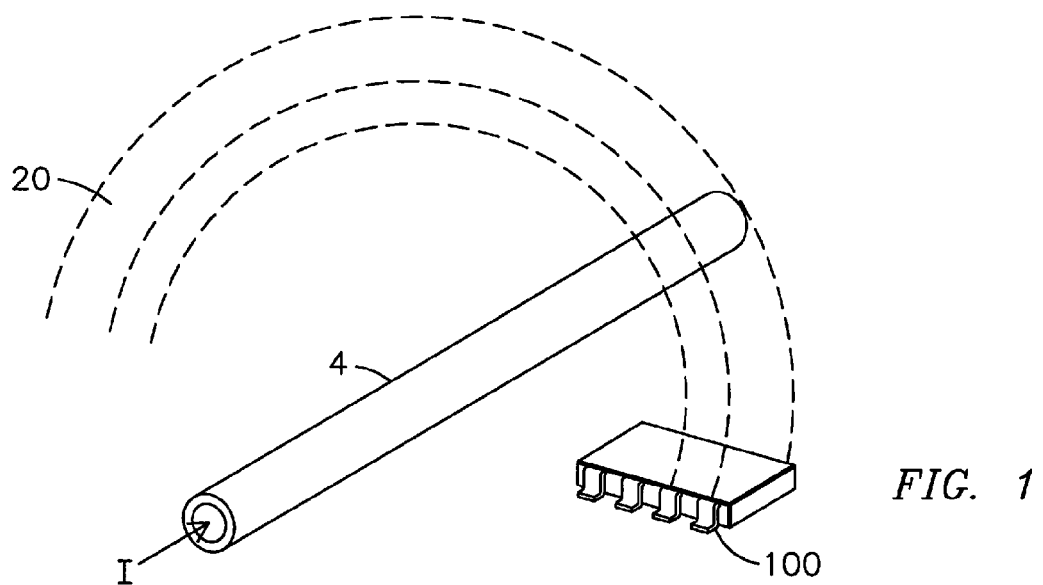
FIG. 1 is a schematic diagram representative of a MEMS-based current and magnetic field sensor.

Although the following describes embodiments of a MEMS sensor configured for electrical current sensing, it is envisioned that the exemplary embodiments may also be used, without limitation, for sensing other physical phenomena responsive to a stimulus generated by the phenomenon and applied to the sensor. FIG. 1 illustrates an exemplary embodiment of a MEMS sensor configured for sensing current and magnetic field described herein and hereinafter generally referred to as "current sensor 100." As shown, conductor 4 carrying a current I generates a magnetic field 20. In accordance with one embodiment of the present disclosure, current sensor 100 can be used to sense the current I in a current carrying conductor 4, without having to make physical contact with the current carrying conductor. In accordance with the illustrated embodiment, the MEMS current sensor 100 operates to sense and determine the current I carried by the conductor 4 by making use of a Lorentz force resulting when current sensor 100 is positioned in the magnetic field 20 generated by current I. In one embodiment, the current sensor 100 includes a magnetic field sensing component having a tunneling current based magneto-MEMS component for sensing magnetic fields and for providing, in response thereto, an indication of the current present in the respective conductors to be measured.

The advantageous size of a MEMS-based current and magnetic field sensor, such as current sensor 100 described herein, facilitates the sensing of current in applications where space is limited. Moreover, the use of MEMS-based components provides a current sensor that is highly accurate, reliable, robust, and introduces little to no error to the current being sensed. Due, at least in part, to the non-contact sensing methods described herein for sensing current using MEMS current sensor 100, the MEMS current sensor 100 preferably has no impact on the magnitude and/or direction of the current being sensed. For example, given the dimensions of MEMS-based components and the sensitivity of the same, the MEMS current sensor 100 preferably does not introduce or cause any appreciable variation or change in the current being sensed or measured. Moreover, the MEMS current sensor 100 is advantageous for its reduced cost and significantly reduced size over existing current sensors. Further, due to micro-lithography and micro-fabrication techniques, the fabrication of the MEMS current sensor 100 is advantaged through increased accuracy and precision.

Presently, MEMS generally refer to micron-scale structures that, for example, can integrate a multiplicity of diverse elements, e.g., mechanical elements, electromechanical elements, sensors, actuators, and electronics, on a common substrate through micro-fabrication technology. It is contemplated, however, that many techniques and structures presently available in MEMS devices will in just a few years be available via nanotechnology-based devices, e.g., structures that may be smaller than 100 nanometers in size. Accordingly, even though example embodiments described throughout this document may refer to MEMS-based devices, it is submitted that the inventive aspects of the present invention should be broadly construed and should not be limited to micron-sized devices.

Figure 2:
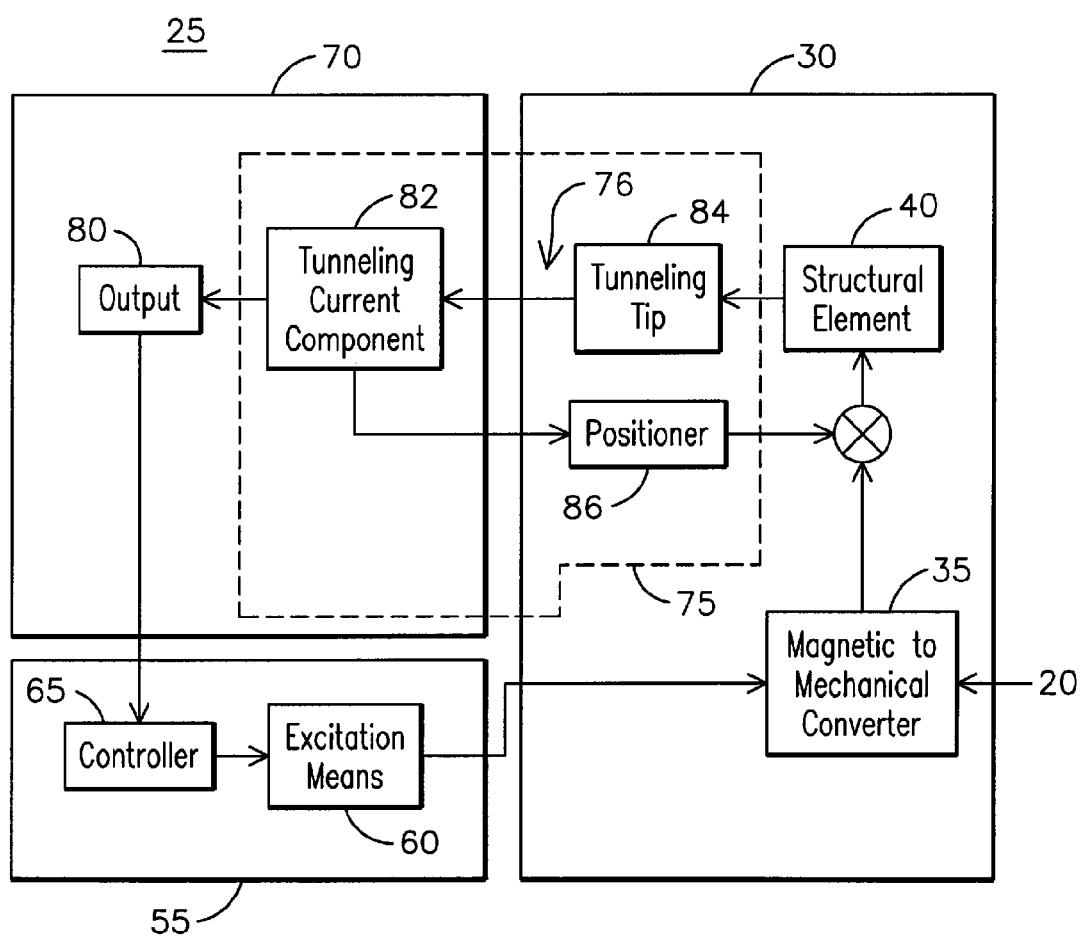
FIG. 2 is a schematic diagram illustrating an example embodiment of a tunneling current-based MEMS current sensor.

FIG. 2 is a schematic diagram illustrating one embodiment of a MEMS-based magnetic field sensing component 25 of MEMS-based current sensor 100. The MEMS-based magnetic field sensing component 25 senses magnetic fields such as magnetic field 20 and provides an indication of the current in a corresponding current carrying conductor, such as conductor 4. The sensed indication of the current may include both a magnitude and a directional component regarding the current being sensed. In one embodiment, the sensed indication of the current is an electrical indication of the current being sensed.

In the illustrated embodiment of FIG. 2, the MEMS-based magnetic field sensing component 25 includes a tunneling current-based magneto-MEMS component 30, an output component 70, and a compensator 55. The tunneling current-based magneto-MEMS component 30 senses a magnetic field and, in response thereto, converts the sensed magnetic field to a mechanical indicator of a corresponding current I. The output component 70 provides an output indicative of the current I in the conductor being measured. In one embodiment, output from the output component 70 may take the form of an electrical signal indicative and representative of the magnitude and sign of the current flowing in the conductor being measured. Output component 70 may interface with a memory, an indicator (e.g., a display screen), and/or another device or apparatus (e.g., a digital signal processor or computer-based analyzer) for further processing.

In the illustrated embodiment, the tunneling current-based magneto-MEMS component 30 includes a magnetic-to-mechanical converter 35 for converting the magnetic representation of the current I to a mechanical change. In one embodiment, the magnetic-to-mechanical converter 35 may be a conductor such as a coil. Additionally, the illustrated tunneling current-based magneto-MEMS component 30 includes a structural component 40 for providing structural support to the 40 tunneling current-based magneto-MEMS component 30. The structural component 40 may represent one or more heterogeneous or homogeneous structures, devices, materials, assemblies, sub-systems, and so forth. For example, in one embodiment, the structural component 40 may represent a first structural element in the form of a first fixed element and a second structural element in the form of a moving element. In one embodiment, the structural component 40 is responsive to the mechanical change provided by the magnetic-to-mechanical converter 35 and provides a mechanical indicator representative of the current I. The mechanical indicator may be representative of movement experienced by the structural component 40 that registers or otherwise indicates the sensing of the magnetic field. In one embodiment, the mechanical indicator may be a displacement of the structural component 40. In one embodiment, the structural component 40 may include one or more of a deflectable membrane, a cantilever, a beam, a diaphragm, a flexure member, a cavity, a surface micro-machined structure, a bulk micro-machined structure, a comb structure, a bridge or any number of other structural devices. Moreover, the mechanical indicator provided by the structural component 40 may convey the vector space value of the mechanical indicator, including one or more of an associated amplitude, direction, speed, and any other characteristic thereof that can be used to convey the vector space value of the mechanical indicator.

In one embodiment, the tunneling current-based magneto-MEMS component 30 includes at least one mechanical change to electrical converter 75 for converting the mechanical indicator provided by structural component 40 into an electrical signal representative of the sensed current I. In one embodiment, the mechanical-to-electrical converter 75 converts the sensed mechanical indicator for interpretation and/or further processing by the output stage 80. In one embodiment, the mechanical-to-electrical converter 75 is based on a tunneling current technique. In particular, the mechanical-to-electrical converter 75 may include a tunneling current circuit 76 having a tunneling current component 82. In one embodiment, the tunneling current component 82 may be configured for establishing, monitoring, and maintaining a tunneling current between a fixed element of the structural component 40 and a moving element displaced responsive to the sensed current I.

The tunneling current component 82 may be coupled to a tunneling current focusing element, such as a tunneling tip 84 operating, for example, in conjunction with a positioner 86 for establishing a tunneling current therebetween. In an aspect of the invention, a value of a tunneling current between the tunneling tip 84 and the positioner 86 may be indicative of a displacement of the moving element. In an embodiment, the positioner 86 may include one or more electrodes, disposed, for example, on one or both the fixed and moving elements of the structural component 40. For example, an electrode of the positioner 86 disposed on the moving element may be paired with the tunneling tip 82 disposed on the fixed element to form a tunneling tip/electrode pair for establishing a tunneling current between the tunneling tip 84 and the electrode.

In an embodiment, the compensator 55 may be used to establish a bias current in a coil of the magnetic-to-mechanical converter 35 for mechanically indicating strength of a magnetic field. The compensator 55 may also be used to compensate for effects due to e.g., mechanical tolerances, aging of the sensor, temperature, environmental factors, etc. The compensator 55 may include an excitation source (such as a current source) 60 and a controller 65. The excitation source 60 may provide excitation quanta (i.e., an amount of excitation energy) for use by the MEMS current sensor 100. The controller 65 may control, for example, a switching and an application of the excitation quanta of the excitation source 60. The controller 65 may be, for example, a switch, an analog processor, a digital signal processor, a digital computing device or an analog-computing device. In the present example, the controller controls at least an on, off, and a value of a bias current supplied to the magnetic-to-mechanical converter 35.

Although the output component 70, the tunneling current-based magneto-MEMS component 30, and the compensator 55 of FIG. 2 appear as separate components, these components and their respective functional blocks can be further combined or further partitioned without departing from the spirit and scope of the disclosure.

Figure 3:
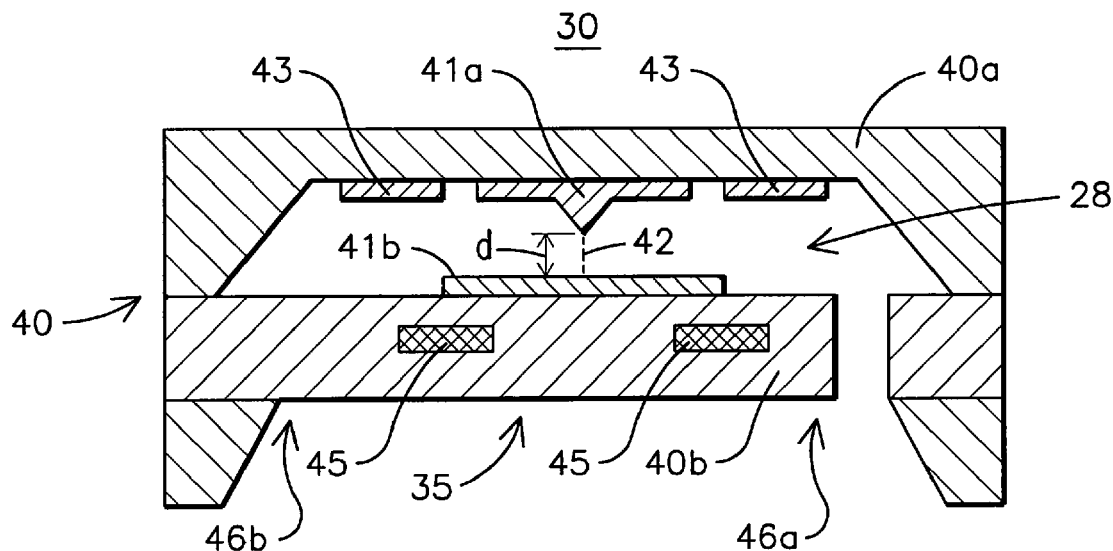
FIG. 3 illustrates a schematic sectional side elevational view of aspects of a tunneling current based magneto-MEMS component.

FIG. 3 illustrates one embodiment of a tunneling current-based magneto-MEMS component 30. In FIG. 3, tunneling current-based magneto-MEMS component 30 includes structural component 40 shown as a first structural element 40a and a second structural element 40b positioned substantially opposite the first structural element 40a. As shown in FIG. 3, first structural element 40a may be a fixed element, and second structural element 40b may be a moving element spaced away from the first structural element 40a and movable relative to the first structural element 40a. For example, the second structural element 40b may include a cantilever fixed at a supported end 46b and free to move at a free end 46a.

In one embodiment, the second structural element 40b includes a mechanical sense component 45, such as a conductor coil, responsive to a magnetic field when the coil is energized with an electrical current. The first mechanical sense component 45 may represent an electrically conductive region or material (herein referred to as an "electrode") contained by or coupled to the mechanical sense component 45. In one embodiment, the first and second structural elements 40a and 40b respectively represent first and second substrates. For example, the mechanical sense component 45 may each represent a layer, region, or trace of conductive material, such as a metal, disposed on or formed within a substrate such as Silicon. In one embodiment, the first structural element 40a represents a substrate having a cavity 28 defined therein.

In another embodiment, the structural elements 40a, 40b include respective first and second tunneling current circuit elements 41a and 41b. The tunneling current circuit elements 41a and 41b may represent electrodes contained by or coupled to the first and second structural elements 40a, 40b, respectively. The first tunneling current circuit element 41a may be configured as a tunneling tip for sensing a tunneling current 42 established between the first tunneling current circuit element 41a and the second tunneling current circuit element 41b. The first structural element 40a may also include a positioning element 43, such as an electrode contained by or coupled to the first structural element 40a. The positioning element 43, operated in conjunction with the mechanical sense component 45 and may be configured for controlling a separation distance d between the first and second structural elements, such as in response to positioner 86 of FIG. 2.

Figure 4:
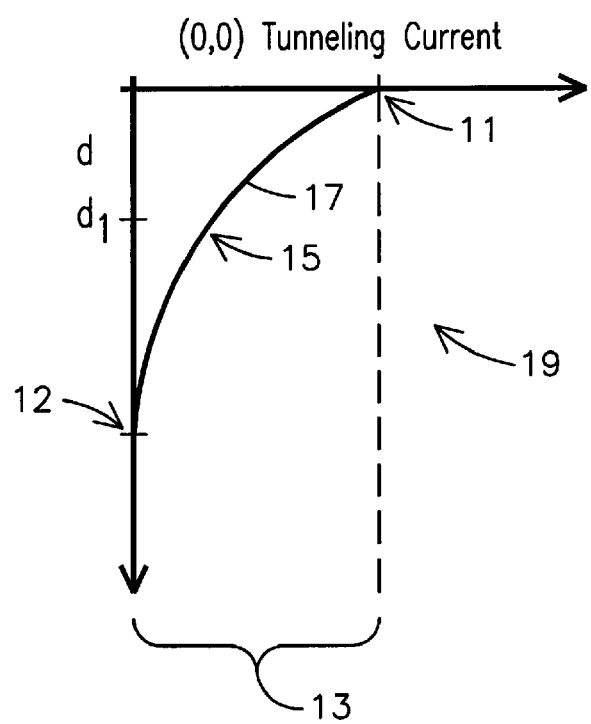
FIG. 4 is an example graph of tunneling current versus separation distance illustrating an exponential variation of tunneling current with separation distance.

In accordance with one embodiment, during operation of the tunneling current-based magneto-MEMS component 30, a voltage differential may be applied across the first structural element 40a and second structural element 40b causing a tunneling current 42 to develop between tunneling current circuit elements 41a and 41b. Because a value of the tunneling current 42 between the tunneling current circuit elements 41a and 41b is a function of a distance d between the elements 41a and 41b, a change in distance d will produce a corresponding change in the tunneling current 42, such as a change in a value of the tunneling current 42. FIG. 4 illustrates an exemplary graph 19 showing how a value of the tunneling current 42 may vary according to increasing distance d between tunneling current circuit elements 41a and 41b. Point 11 on the graph 19 indicates an ohmic conduction state when d=0, for example, when the tunneling current circuit elements 41a and 41b are in contact. In this state, the tunneling current 42 becomes a constant ohmic contact current. Point 12 on the graph 19 indicates an open circuit state when d is sufficiently large so that no tunneling current exists between tunneling current circuit elements 41a and 41b. In between points 11 and 12, the curve 17 represents an exponential-type variation of tunneling current 42 during a tunneling current phase 13. Accordingly, a distance d between tunneling current circuit elements 41a and 41b may be determined based on a sensed value of the tunneling current in the tunneling phase.

Returning to the illustrated embodiment of FIG. 3, the magnetic-to-mechanical converter 35, comprising mechanical sense component 45, may be coupled to the second structural element 40a such that when the tunneling current-based magneto-MEMS component 30 is placed in the vicinity of an external current carrying conductor, and a small bias current is flowed in the first mechanical sense component 45 of the magnetic-to-mechanical converter 35, the magnetic field generated by the external conductor will exert a force (e.g., Lorentz force) on the magnetic-to-mechanical converter 35. The bias current used may be in the range of microamps (uA) or milliamps (mA), however a typical bias current might be 1-10 mA. Moreover, a DC or AC bias current may be used without modification to the tunneling current-based magneto-MEMS component 30. Moreover, by driving an AC bias current at frequency that coincides with a resonant frequency of the device, it is possible to further increase sensitivity of the device.

The Lorentz force will cause the second structural element 40b (e.g. moving element) to deflect at the free end 46a about a supported end 46b, such as toward or away from the first structural element 40a in a direction essentially perpendicular to a plane of the first structural element 40a accordingly to a direction of the magnetic field. An amplitude and direction of the deflection experienced by the second structural element 40b is proportional to current I (see FIG. 1) and its polarity. Therefore, the current I flowing in the current conductor may be sensed based on a degree of deflection generated in the second structural element 40b. The resulting deflection increases or decreases the distance d, and in turn changes a value of the tunneling current 42, for example, according to the tunneling curve 17 of FIG. 4. By sensing a value of the tunneling current 42, the distance d may be determined.

While discussed primarily in the context of using the Lorentz force, the magnetic-to-mechanical converter 35 may be modified to use mutual inductance, a moving loop and/or a magnetic field generated by an external current carrying conductor. Additionally, other characteristic relationships may be used to derive a mechanical indicator of the mechanical indicator corresponding to the current being sensed.

In an embodiment, positioning element 43, such as a current conducting electrode formed as a coil generating a Lorentz force, may be used to obtain a force balance or an equilibrium condition and/or to perform active sensing or zero balance sensing. For example, a distance d may be regulated using positioning element 43 to maintain a desired tunneling current value, such as a reference current value, (for example, point 15 on curve 17 of FIG. 4) between tunneling current circuit elements 41a and 41b. In an example embodiment, point 15 on curve 17 of FIG. 4 may be selected as a reference current value corresponding to reference distance. A force, such as an electrostatic force or a magnetic force, acting to deflect the second structural element 40b away from the reference distance may be nulled by forcing the second structural element 40b back to distance $d_1$ between tunneling current circuit elements 41a and 41b. A measure of a restorative force required to move the deflected second structural element 40b back to the reference distance may be interpreted to indicate a value of the current flowing in a conductor generating the Lorentz force causing the deflection. The restorative force may be generated by controlling an electric current in the positioning element 43 for generating a magnetic field producing a desired restorative Lorentz force on the magnetic-to-mechanical converter 35 sufficient to return the deflected second structural element 40b back to the reference distance.

In a tunneling current based MEMS sensor, such as the MEMS current sensor described previously, it is desirable to control a spacing between a tunneling tip and a matching electrode of the sensor. Importantly, may be necessary to maintain a smaller spacing to within a better accuracy than is guaranteed by a manufacturing process or various imperfections in the electronics, such as offset voltages or temperature responsive circuit variations. If the spacing is too large, tunneling current will be too small to measure or will not start. If the spacing is too small, an ohmic contact may result, changing the measurement behavior of the sensor. Accordingly, accurate spacing of the sensing elements and maintenance of a consistent tunneling current operating point is critical in tunneling current based sensors.

Figure 5:
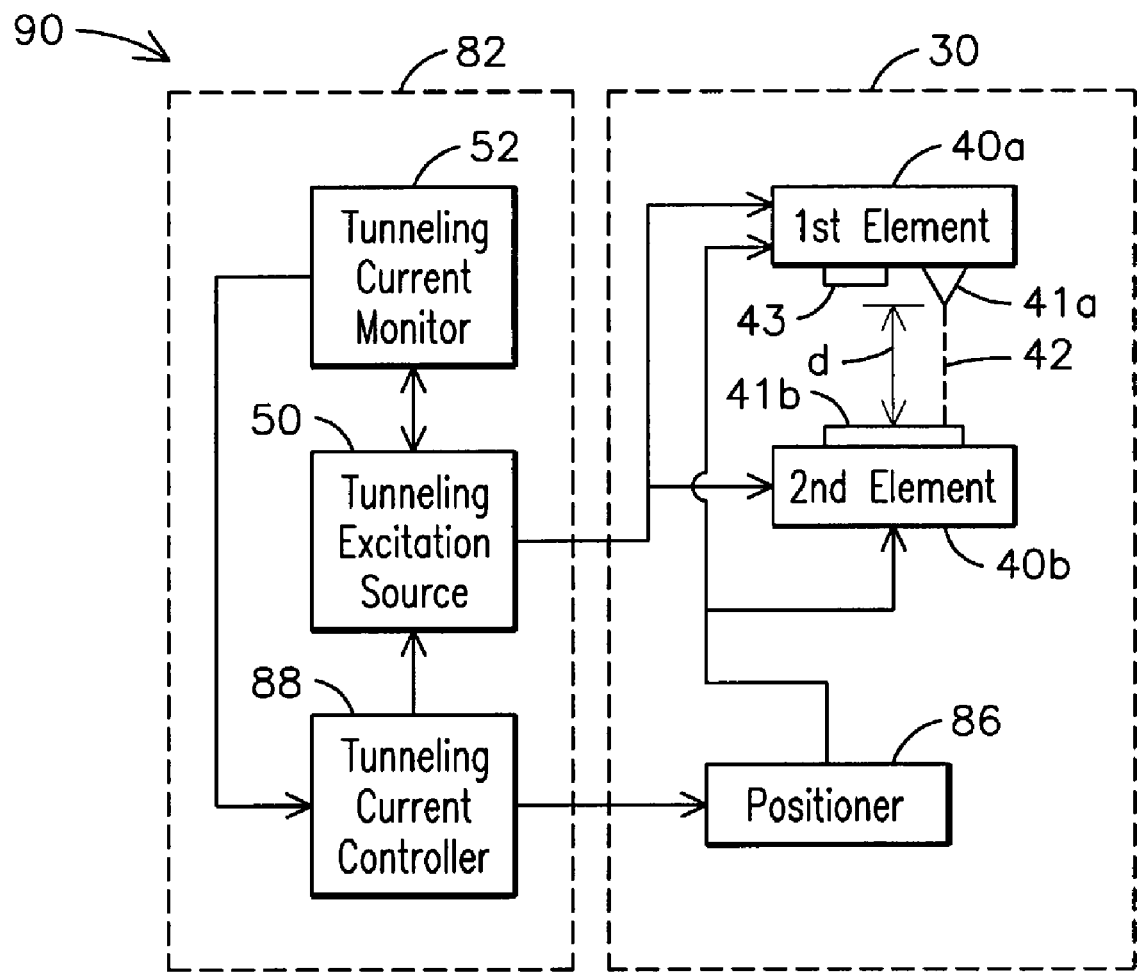
FIG. 5 is a schematic block diagram representative of a tunneling current component.

FIG. 5 is a block diagram of an example tunneling current control system 90 that may be used to control a tunneling current in a MEMS sensor, such as the MEMS-based magnetic field sensing component 25 of FIG. 2. The tunneling current control system 90 may include a tunneling current component 82 and associated elements for controlling a tunneling current between a first structural element 40a and a second structural element 40b of a tunneling current-based magneto-MEMS component 30, such as shown in FIG. 3. The first structural element 40a and the second structural element 40b may be spaced apart from one another a distance d. One, or both, of the elements 40a, 40b may be movable relative to one another responsive to a stimulus acting on one, or both, of the elements 40a, 40b. The tunneling current component 82 may include a tunneling current excitation source 50 for providing a tunneling current 42 between the first structural element 40a and the second structural element 40b. The tunneling current excitation source 50 may be configured for generating a tunneling current that may be used for monitoring the distance d between tunneling current circuit elements 41a and 41b. For example, the tunneling current excitation source 50 may function as a current source for generating the tunneling current 42. In another example embodiment, the tunneling current excitation source 50 may generate a voltage potential difference between the elements 40a, 40b, such as by applying a voltage differential between a tunneling tip 41a on the first structural element 40a and an electrode 41b opposite the tunneling tip 41a on the second structural element 40b.

The tunneling current component 82 may also include a tunneling current monitor 52 for monitoring a change in the tunneling current 42 responsive to movement of one or both of the elements 40a, 40b relative to each other. The positioner 86 may be configured for positioning at least one of the first element 40a and the second element 40b relative to one another. The positioner 86 may include a positioning element 43 and/or electrode 41b as shown in FIG. 3. Positioning element 43 may include an electrostatic element, a magnetic element, a thermal element, and/or a piezoelectric element configured for positioning the element 40a, 40b relative to one another.

The tunneling current component 82 may also include a tunneling current controller 88 in communication with the tunneling current monitor 52 for controlling the positioner 86 to position at least one of the first structural element 40a and the second structural element 40b at a desired spacing. The inventors have innovatively realized that by initially positioning the elements 40a, 40b sufficiently close to one another to achieve an ohmic contact type current between them, and then positioning the elements 40a, 40b sufficiently far away from each other to achieve a desired tunneling current, the sensor may be configured, or calibrated, so as to remove biases, such as electrical and/or mechanical biases. For example, such a calibration technique may be used to compensate for manufacturing tolerances that may result in different spacing of the structural elements 40a, 40b from device to device that result in corresponding differences in tunneling current operating values corresponding to these different spacings.

In an example embodiment, the structural elements of the MEMS based magnetic field sensing component 25 may be sized in the 100 nm range. Using present MEMS manufacturing techniques, it may be difficult to maintain sufficiently tight tolerances on such a small scale. Accordingly, the example calibration techniques described herein may help to solve problems associated with manufacturing tolerances and/or other mechanical differences to ensure that tunneling based MEMS current sensors may be configured for operating in a desired mode, such as at a consistent element spacing for achieving a desired tunneling current between points 11 and 12 on curve 17 of FIG. 4. In addition, because the described MEMS sensors may operate in a 10 nanoampere range, it is critical that electrical biases be removed to ensure consistent operation. Accordingly, this calibration technique may be used to compensate for such biases that may result from differences in operation of electrical components and/or drift of the components over time and/or temperature.

Figure 6:
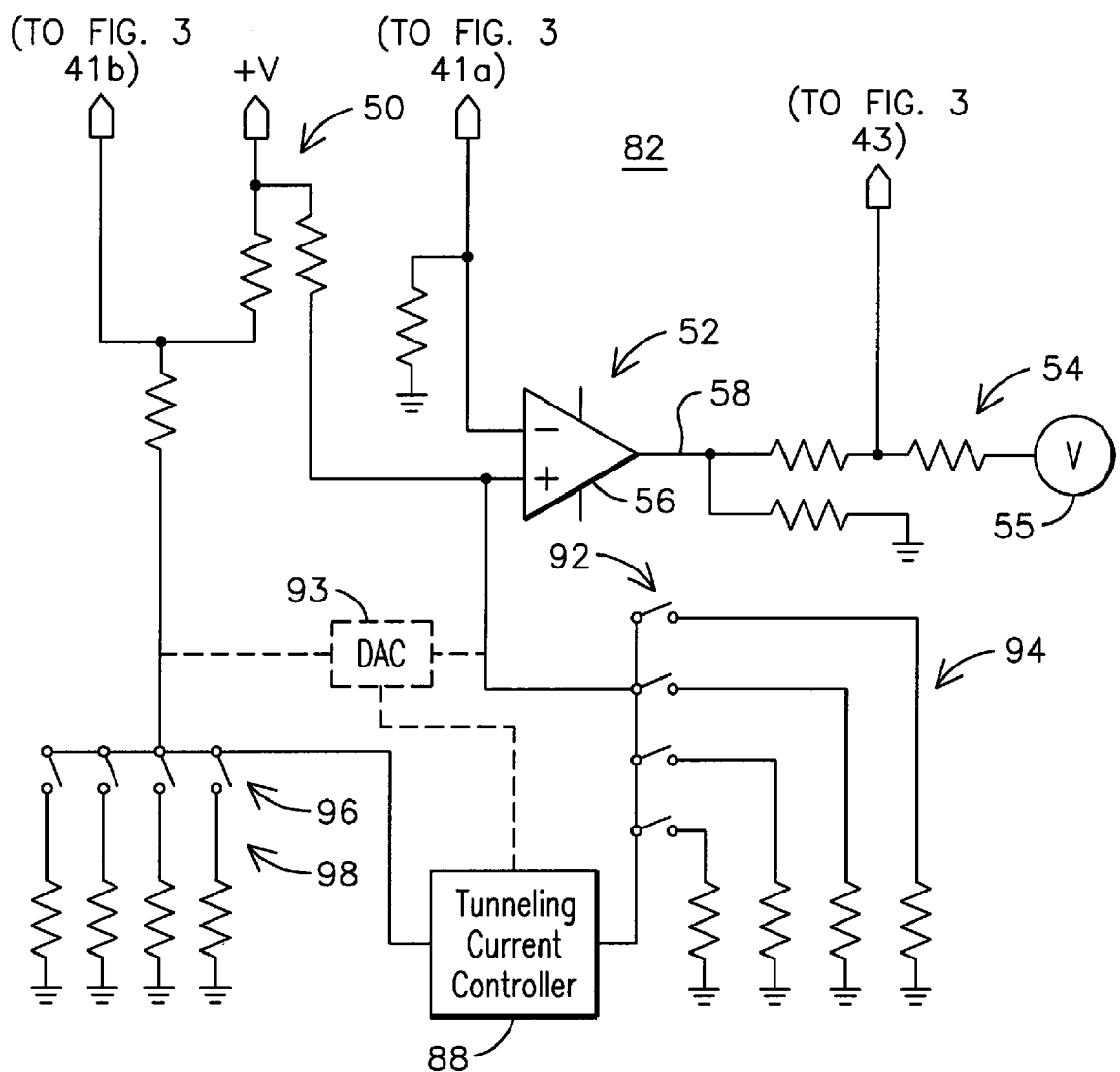
FIG. 6 is a circuit schematic diagram representative of a tunneling current component.

FIG. 6 is a schematic circuit diagram of an example tunneling current component 82. The tunneling current component 82 may include tunneling current excitation source 50 configured for generating a tunneling current used for monitoring a distance d between tunneling current circuit elements, such as elements 41a and 41b of FIG. 3. For example, the tunneling current generator 50 may be configured for establishing a voltage potential between elements 41a and 41b capable of generating a tunneling current therebetween.

The tunneling current component 82 may also include a tunneling circuit monitor 52 for monitoring the generated tunneling current. For example, the tunneling circuit monitor 52 may include a comparator 56 for comparing the respective voltages at the tunneling current circuit elements 41a and 41b. Based on a comparison between the respective voltages, the comparator 56 may generate a positioning signal 58 for driving the positioning element 43 of FIG. 3 to position the second structural element 40b with respect to the first structural element 40a to maintain a desired tunneling current between tunneling current circuit elements 41b and 41a. Power for driving the positioning element 43 based on the positioning signal 58 may be provided by driver circuit 54 that may include a voltage source 55.

In an example embodiment, the tunneling current component 82 may be configured, or calibrated, for remove biases, such as electrical and/or mechanical biases in the MEMS based magnetic field sensing component 25. Accordingly, a controller 88, for example, in communication with the tunneling current monitor 52, may be configured for controlling the positioner 86 to position at least one of the first structural element 40a and the second structural element 40b at a first spacing between the structural elements 40a, 40b for configuring the tunneling current control system 90 in a referencing mode. The referencing mode may include a reference current condition, such as an ohmic conduction current condition resulting from an ohmic contact between the tunneling circuit elements 41a, 41b of FIG. 6. The ohmic contact may be commanded by the controller 88 to operate the positioner 43 to bring one, or both, element 40a, 40b sufficiently closes to create the ohmic contact between tunneling circuit elements 41a, 41b. In another embodiment, the referencing mode may include a reference resistance condition that may include a linear resistance characteristic, such as a constant resistance, representative of an ohmic contact between tunneling circuit elements 41a, 41b.

The tunneling current controller 88 may also be configured for positioning at least one, or both, of the structural elements 40a, 40b at a second spacing different from the first spacing for configuring the tunneling current control system 90 in a sensing mode, whereby the tunneling current control system 90 is calibrated with respect to the referencing mode. For example, the tunneling current controller 88 may be configured for moving the structural elements 40a, 40b away from the referencing mode position, such as by spacing the structural elements 40a, 40b further apart. The tunneling current controller 88 may position the structural elements 40a, 40b so that a desired tunneling current is developed between the tunneling circuit elements 41a, 41b for sensing changes in the tunneling current due to other stimuli acting on the sensor, such as a magnetic force induced by current flowing in a conductor proximate the sensor. For example, the tunneling current controller 88 may be configured positioning the structural elements 40a, 40b to achieve a tunneling current between points 11 and 12 on curve 17 of FIG. 4.

The tunneling current controller 82 may include a first control circuit 92, such as a bias voltage generator, for controlling the positioner 86 to bring the first element 40a and the second element 40b sufficiently close for configuring the MEMS based magnetic field sensing component 25 in the referencing mode and then moving the first element 40a and the second element 40b apart into the sensing mode. For example, the first control circuit 92 may control a voltage at an input to comparator 56 to generate an appropriate signal 58 for moving the elements 40a, 40b. The first control circuit 92 may include a voltage divider network 94, such as a digital potentiometer, for providing a variable voltage for energizing the positioner 86. In another example embodiment, the first control circuit 90 may include a digital to analog converter 92 (indicated by dotted lines) for providing a variable analog voltage for energizing the positioner 86.

In another example embodiment, the tunneling current controller 82 may include a second control circuit 96 for controlling an electrical potential difference between the tunneling electrode 41b and the tunneling current focusing element 41a. For example, the second control circuit 92 may control a voltage of the tunneling electrode 41b to generate a desired potential difference between the tunneling electrode 41b and the tunneling current focusing element 41. The second control circuit 96 may include a voltage divider network 98, such as a digital potentiometer, for providing a variable voltage for generating a desired potential difference. In another example embodiment, the first control circuit 96 may include a digital to analog converter 92 (indicated by dotted lines) for providing a variable analog voltage to generate a desired potential difference.

Figure 7:
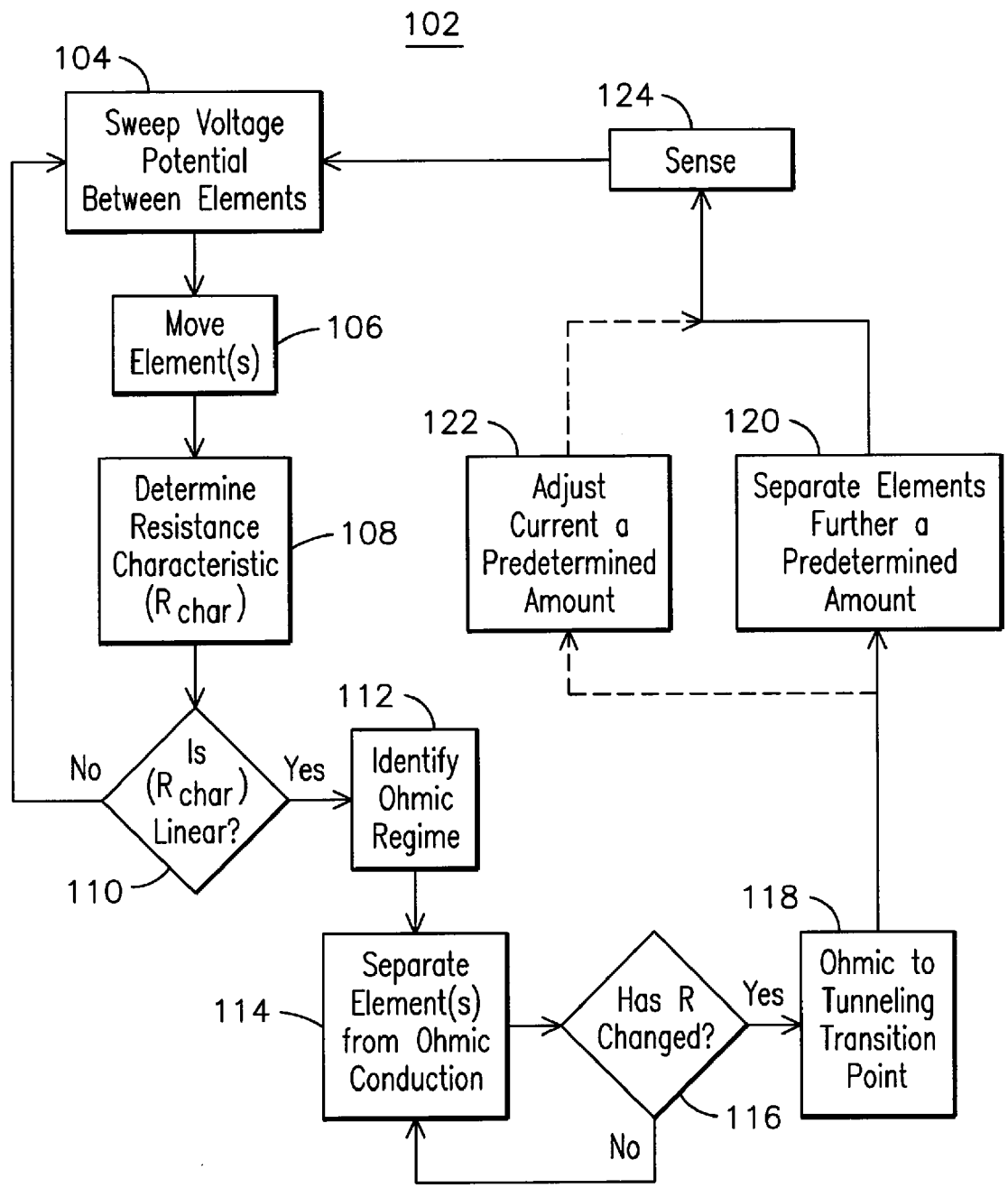
FIG. 7 is a flow chart of an example method for controlling a tunneling current between elements of a MEMS sensor.

FIG. 7 is a flow chart 102 of an example method for controlling a tunneling current between a first element and a second element of a micro-electro-mechanical system (MEMS) sensor, such as the sensor shown in FIGS. 5 and 6. The method may include determining an ohmic conduction condition by varying, or sweeping, a voltage potential 104 between first structural element 40a and a second structural element 40b, while moving one or both of the elements 106 to identify an ohmic conduction condition. The method may include determining a resistance characteristic 108, based, for example, on the varied voltage potentials and the current 42 generated between first element 40a and the second element 40b responsive to the varied voltage potentials. When the resistance characteristic includes a relationship indicative of non-ohmic conduction, such as a non-linear relationship 110, the method may include repeating steps 104-108. When the resistance characteristic includes a relationship indicative of ohmic conduction, such as a linear relationship 110, the method may include identifying an ohmic conduction condition 112 and then moving one or both elements apart from one another 114 until the resistance characteristic changes, such as going from a linear characteristic to a non-linear characteristic indicative of a ohmic to tunneling current conduction point 118. When an ohmic to tunneling current conduction point 118 is identified, the method may include adjusting the relative position of one, or both, elements 40a, 40b 120 with respect to each other a predetermined amount to achieve a desired tunneling current therebetween. In another example embodiment (indicted by dotted lines) the method may include leaving the elements 40a, 40b at the position establishing the ohmic to conduction transition point and then adjusting the current between the elements 40a, 40b 122 to achieve a desired tunneling current value. For example, the current 42 may be adjusted by adjusting a voltage potential between the tunneling electrode 41b and the tunneling current focusing element 41a of FIG. 5 to achieve the desired tunneling current value. At this point, sensing 124 of a stimulus may be performed. In another example embodiment, the method may include periodically performing steps 104-120 (and/or 122) to ensure the sensor remains calibrated. For example, a frequency of performing the steps, i.e. calibration, may be selected to be different than a frequency of a stimulus, such as a frequency of an alternating current being sensed.

Figure 8:
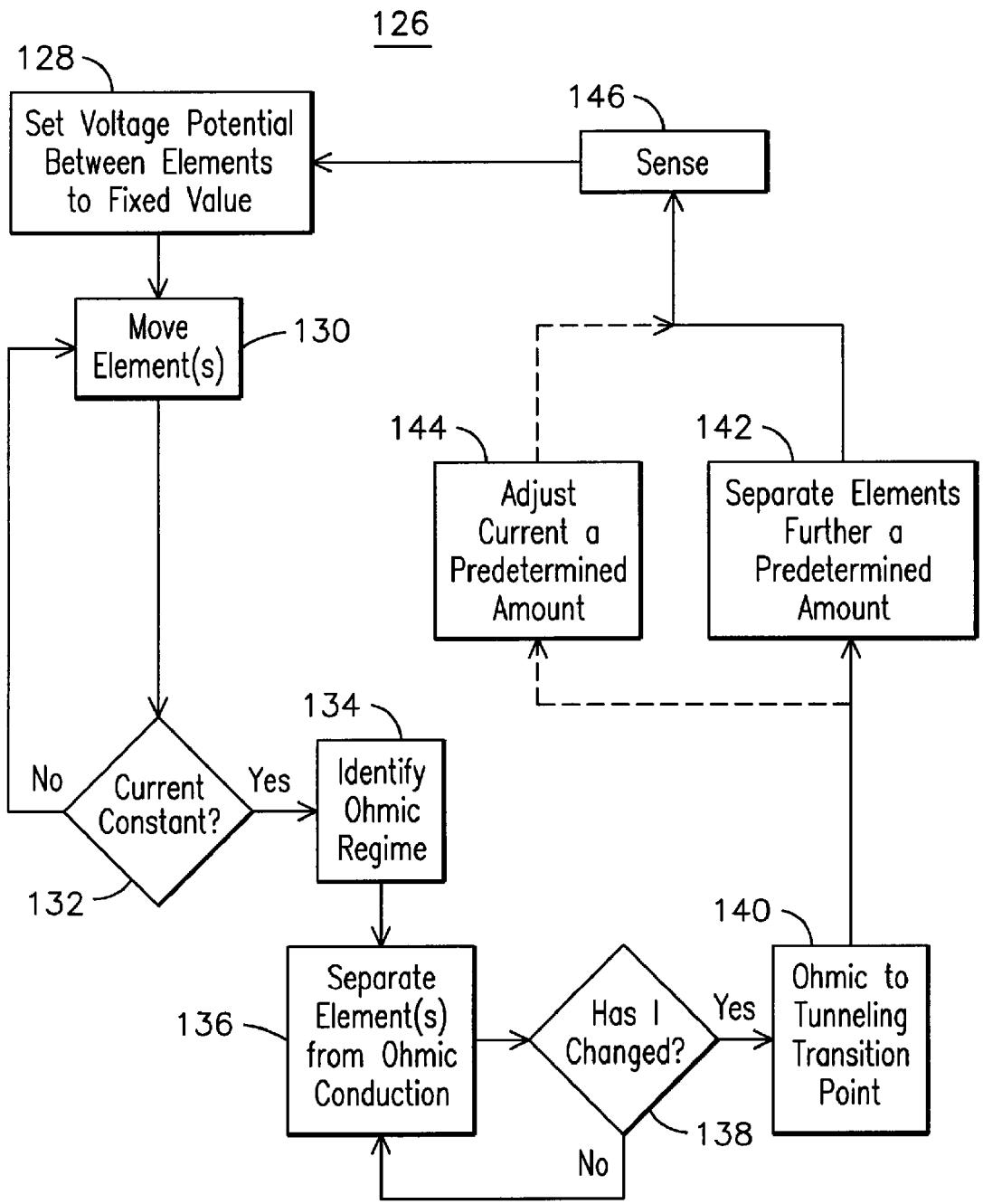
FIG. 8 is a flow chart of another example method for controlling a tunneling current between elements of a MEMS sensor.

FIG. 8 is a flow chart 126 of another example embodiment of a method for controlling a tunneling current between a first element and a second element of a micro-electromechanical system (MEMS) sensor, such as the sensor shown in FIGS. 5 and 6. The method may include moving one, or both, of the elements 40a, 40b of FIG. 5 130 to identify an ohmic conduction condition. The method may include determining when the current 42 between the tunneling electrode 41b and the tunneling current focusing element 41a of FIG. 5, becomes constant 132. Accordingly, the elements 40a, 40b, may be moved until the current 42 becomes constant, a condition indicative of an ohmic conduction condition. When operation in an ohmic conduction regime is identified, 134, the method may include separating the elements 40a, 40b from the ohmic conduction condition. For example, separating the elements may include moving one, or both, elements 40a, 40b apart from one another 136 until the current 42 changes 138, such as by going from a constant current to a varying current indicative of a ohmic to tunneling current conduction point 140. When an ohmic to tunneling current conduction point 140 is identified, the method may include adjusting the relative position of one, or both, elements 40a, 40b 142 with respect to each other a predetermined amount to achieve a desired tunneling current 42 therebetween. In another example embodiment (indicted by dotted lines) the method may include leaving the elements 40a, 40b at the position establishing the ohmic to conduction transition point and then adjusting the current between the elements a predetermined amount 144 to achieve a desired tunneling current value, such as by adjusting a voltage potential between the tunneling electrode 41b and the tunneling current focusing element 41a of FIG. 5. At this point, sensing 146 of a stimulus may be performed. In another example embodiment, the method may include periodically performing steps 128-142 (and/or 144) to ensure the sensor remains calibrated. For example, a frequency of performing the steps, i.e. calibration, may be selected to be different than a frequency of a stimulus, such as an alternating current, being sensed.

Due to batch manufacturing techniques of micro-machining and the associated cost efficiencies, the MEMS-based current sensor 100 as described herein can be manufactured in large batches using for example, photolithography and etching. As noted above, the MEMS device of FIG. 2 is but one example of a current sensor contemplated in accordance with the present disclosure. Other embodiments of the MEMS-based current sensor 100 may include the use of multiple MEMS devices in the current sensor for the purpose of, for example, magnetic field shaping, magnetic field sensing, current value indicating, and other purposes.

While certain embodiments of the present invention have been shown and described herein, such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A system for controlling a tunneling current between a first element and a second element of a micro-electromechanical system (MEMS) sensor, wherein the first element and the second element are spaced apart from one another, at least the first element being movable relative to the second element responsive to a stimulus acting on at least the first element, the system comprising:
   a tunneling current excitation source for providing a tunneling current between a first element and a second element of a MEMS sensor;
   a tunneling current monitor for monitoring a change in the tunneling current responsive to movement of at least the first element relative to the second element;
   a positioner for positioning at least one of the first element and the second element relative to one another; and
   a controller in communication with the tunneling current monitor for controlling the positioner to position at least one of the first element and the second element at a first spacing between the first element and the second element for configuring the system in a referencing mode and to position at least one of the first element and the second element at a second spacing for configuring the system in a sensing mode, whereby the system is calibrated with respect to the referencing mode.

2. The sensor of claim 1, wherein the referencing mode comprises a reference current condition.

3. The method of claim 2, wherein the reference current condition comprises an ohmic conduction current condition.

4. The sensor of claim 1, wherein the referencing mode comprises a reference resistance condition.

5. The sensor of claim 4, wherein the reference resistance condition comprises a linear resistance characteristic.

6. The sensor of claim 5, wherein the linear resistance characteristic comprises a constant resistance.

7. The sensor of claim 1, wherein the positioner comprises at least one of an electrostatic element, a magnetic element, a thermal element, and a piezoelectric element.

8. The sensor of claim 1, wherein the tunneling current excitation source comprises:
   a tunneling electrode disposed on one of the first element and the second element; and
   a tunneling current focusing element disposed on an opposite one of first element and the second element proximate the tunneling electrode.

9. The sensor of claim 8, wherein the tunneling current focusing element comprises a tunneling tip.

10. The sensor of claim 8, wherein the controller comprises a first control circuit for energizing the positioner to bring the first element and the second element sufficiently close for configuring the system in the referencing mode.

11. The sensor of claim 10, wherein the first control circuit comprises a digital to analog converter for providing a variable analog voltage for energizing the positioner.

12. The sensor of claim 10, wherein the first control circuit comprises a bias voltage generator.

13. The sensor of claim 10, wherein the bias voltage generator comprises a voltage divider network for providing a variable analog voltage for energizing the positioner.

14. The sensor of claim 13, wherein the voltage divider network comprises a digital potentiometer.

15. The sensor of claim 10, wherein the controller comprises a second control circuit for controlling an electrical potential difference between the tunneling electrode and the tunneling current focusing element.

16. The sensor of claim 15, wherein the second control circuit comprises a digital to analog converter for providing a variable analog voltage for controlling the electrical potential difference.

17. The sensor of claim 16, wherein the second control circuit comprises a voltage divider network for providing a variable analog voltage for controlling the electrical potential difference.

18. The sensor of claim 17, wherein the voltage divider network comprises a digital potentiometer.

19. The sensor of claim 1, wherein the stimulus comprises a magnetic field produced by an electrical current flowing in a conductor.

20. A system for controlling a tunneling current between a first element and a second element of a micro-electromechanical system (MEMS) current sensor, wherein the first element and the second element are spaced apart from one another, the first element being movable relative to the second element responsive to a magnetic force produced by an electrical current flowing in a conductor acting on the first element, the system comprising:
 a tunneling current generator for providing a tunneling current between a first element and a second element of a MEMS current sensor;
 a tunneling current monitor for monitoring a change in the tunneling current responsive to movement of the first element relative to the second element;
 a positioner for positioning the first element relative to the second element; and
 a controller in communication with the tunneling current monitor for controlling the positioner to position the first element at a first spacing between the first element and second element for configuring the system in a referencing mode and to position the first element at a second spacing for configuring the system in a sensing mode, whereby the system is calibrated with respect to the reference current.

21. A method for controlling a tunneling current between a first element and a second element of a micro-electromechanical system (MEMS) sensor, wherein the first element and second element are spaced apart from one another, at least the first element being movable relative to the second element responsive to a stimulus acting on at least one of the first element and second element, the method comprising:
 providing a tunneling current excitation source for generating a tunneling current between a first element and a second element of a MEMS sensor;
 providing a tunneling current monitor for monitoring a change in the tunneling current responsive to movement of at least the first element relative to the second element;
 positioning at least one of the first element and the second element at a first spacing between the first element and second element for configuring the system in a referencing mode; and
 positioning at least one of the first element and the second element at a second spacing different from the first spacing for configuring the system in a sensing mode, whereby the system is calibrated with respect to the referencing mode.

22. The method of claim 21, further comprising positioning at least one of the first element and the second element at a third spacing different from the first spacing and the second spacing for generating a desired sensing tunneling current value.

23. The method of claim 21, further comprising controlling the tunneling current excitation source for generating a desired sensing tunneling current value.

24. The method of claim 21, wherein positioning at least one of the first element and the second element at a first spacing further comprises:
 monitoring a resistance characteristic corresponding to a spacing of the first element and the second element; and
 moving at least one of the first element and the second element until a reference resistance characteristic is achieved.

25. The method of claim 24, wherein the reference resistance characteristic comprises a linear resistance characteristic indicative of ohmic conduction.

26. The method of claim 21, wherein positioning at least one of the first element and the second element at a first spacing further comprises:
 monitoring a current condition corresponding to a spacing of the first element and the second element; and
 moving at least one of the first element and the second element the until a reference current condition is achieved.

27. The method of claim 26, wherein the reference current condition comprises an ohmic conduction current condition.

28. The method of claim 21, further comprising repeatedly performing the positioning steps of claim 21 at a frequency different than a frequency of the stimulus.

* * * * *